US011715400B2

(12) United States Patent
Wang et al.

(10) Patent No.: US 11,715,400 B2
(45) Date of Patent: Aug. 1, 2023

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Wenqiang Wang, Wuhan (CN); Liang Sun, Wuhan (CN); Bingkun Yin, Wuhan (CN); Shijuan Yi, Wuhan (CN); Li Hu, Wuhan (CN); Likun Cheng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 188 days.

(21) Appl. No.: 17/280,883

(22) PCT Filed: Nov. 23, 2020

(86) PCT No.: PCT/CN2020/130870
§ 371 (c)(1),
(2) Date: Mar. 27, 2021

(87) PCT Pub. No.: WO2022/099781
PCT Pub. Date: May 19, 2022

(65) Prior Publication Data
US 2022/0358863 A1     Nov. 10, 2022

(30) Foreign Application Priority Data

Nov. 13, 2020  (CN) .......................... 202011266812.2

(51) Int. Cl.
G09G 3/00   (2006.01)
G09G 3/32   (2016.01)
H10K 77/10  (2023.01)

(52) U.S. Cl.
CPC .............. *G09G 3/035* (2020.08); *G09G 3/32* (2013.01); *H10K 77/111* (2023.02);
(Continued)

(58) Field of Classification Search
CPC ... H01L 27/32–3293; H01L 2251/5338; H01L 51/0097; H01L 27/3276;
(Continued)

(56) References Cited

U.S. PATENT DOCUMENTS

2013/0105833 A1* 5/2013 Weaver ............... H01L 27/3209
                                                      257/89
2016/0268352 A1* 9/2016 Hong .................. H01L 27/3276
(Continued)

FOREIGN PATENT DOCUMENTS

CN     108417607 A     8/2018
CN     108933148 A     12/2018
(Continued)

OTHER PUBLICATIONS

International Search Report in International application No. PCT/CN2020/130870, dated Aug. 13, 2021.
(Continued)

*Primary Examiner* — Sanjiv D. Patel
(74) *Attorney, Agent, or Firm* — PV IP PC; Wei Te Chung; Zhigang Ma (57) ABSTRACT

A display panel and a display device are provided. The display panel includes a flexible substrate and a plurality of display sections and retractable sections disposed on the flexible substrate in an array, wherein the retractable sections are configured to connect the display sections to each other. Each of the retractable sections includes at least four arc sections, one C-shaped section, and four straight sections. Under external forces in all directions, the arc sections and the C-shaped section extend and are deformed along different directions in a plane, and the straight sections can buffer stresses caused by extension and deformation.

20 Claims, 5 Drawing Sheets

(52) U.S. Cl.
CPC ............... *G09G 2300/0426* (2013.01); *G09G 2300/0452* (2013.01); *G09G 2380/02* (2013.01)

(58) Field of Classification Search
CPC ............ H01L 27/3244; H01L 27/3216; G09G 2300/0426; G09G 3/2003; G09G 2300/0443; G09G 2300/0452
See application file for complete search history.

(56) References Cited

U.S. PATENT DOCUMENTS

| | | |
|---|---|---|
| 2016/0374191 A1 | 12/2016 | Kim |
| 2019/0245027 A1 | 8/2019 | Park |
| 2021/0135133 A1* | 5/2021 | Zhu .................... H01L 27/3276 |

FOREIGN PATENT DOCUMENTS

| | | |
|---|---|---|
| CN | 109036145 A | 12/2018 |
| CN | 109378332 A | 2/2019 |
| CN | 109830504 A | 5/2019 |
| CN | 109923676 A | 6/2019 |
| CN | 110176473 A | 8/2019 |
| CN | 110459571 A | 11/2019 |
| CN | 111210726 A | 5/2020 |
| CN | 111276528 A | 6/2020 |
| CN | 111862815 A | 10/2020 |
| KR | 20170088013 A | 8/2017 |

OTHER PUBLICATIONS

Written Opinion of the International Search Authority in International application No. PCT/CN2020/130870, dated Aug. 13, 2021.
Chinese Office Action issued in corresponding Chinese Patent Application No. 202011266812.2 dated Jun. 28, 2021, pp. 1-7.
Chinese Office Action issued in corresponding Chinese Patent Application No. 202011266812.2 dated Nov. 26, 2021, pp. 1-6.

* cited by examiner

DISPLAY PANEL AND DISPLAY DEVICE

RELATED APPLICATIONS

This application is a Notional Phase of PCT Patent Application No. PCT/CN2020/130870 having international filing date of Nov. 23, 2020, which claims the benefit of priority of Chinese Patent Application Nos. 202011266812.2 filed on Nov. 13, 2020. The contents of the above applications are all incorporated by reference as if fully set forth herein in their entirety.

FIELD OF INVENTION

The present disclosure relates to the field of display technologies, and more particularly, to a display panel and a display device.

BACKGROUND OF INVENTION

Foldable, rollable, flexible, and retractable curved display screens have entered a commercialization stage, changing people's cognition of conventional static display technologies and meeting consumers' need for a new generation of deformable displays.

Wiring layers including various metal wiring layers, inorganic layers, and organic layers are usually formed on a substrate of display panels. Pixel circuits composed of thin film transistors are manufactured on the substrate in an array, and signals among the pixel circuits are transmitted by metal wirings which connect the pixel circuits to form the array. These metal wirings timely transmit signals from an external power supply or a drive chip to pixel units in the display panels, allowing light to pass through display screens, thereby allowing users to see corresponding texts, pictures, or videos on the screens. When the display panels are deformed, the metal wirings will be deformed along with the pixel units, and after repeated bending, the metal wirings will be irreversibly deformed, thereby causing drive signals unable to be transmitted normally. Taking flexible organic light-emitting diode (OLED) panels as an example, a substrate in a display area is manufactured with thin film transistors (TFTs), and on the thin film transistors, an organic light-emitting material is evaporated between an anode and a cathode, thereby allowing pixels to emit light by controlling electric currents. A non-display area comprises gate drive circuits on both sides of a pixel array, the gate drive circuits comprise input signal sources, such as clock signals, power signals, start signals, and liquid crystal signals, and peripheries of the gate drive circuits are further provided with encapsulation structures. Since in current flexible OLED display screens, metal wirings for transmitting signals are usually linear or partially bent, the metal wirings can still transmit signals when bent in specific positions, while the metal wirings are easy to break when deformed in a plurality of positions or deformed irregularly in a large area of a certain region. Therefore, products are defective, and images are distorted in a certain region of the display screens.

In summary, it is necessary to design a new display panel to solve the above technical problems of deformable display screens only having display function in a certain spatial direction, and a display device layer and a voltage transmission layer having permanent fracture and losing effectiveness after flexible display panels are stretched and deformed in any spatial directions. Therefore, the present disclosure can ensure that images are not distorted after the screens light up, and realize a function of returning to an original state normally after continuous stretches and deformation in a plurality of directions, thereby achieving characteristics of freely stretching display.

Technical problem: embodiments of the present disclosure provide a display panel and a display device to solve problems of deformable display screens only having display function in a certain spatial direction, and a display device layer and a voltage transmission layer having permanent fracture and losing effectiveness after flexible display panels are stretched and deformed in any spatial directions in current technology. Therefore, the present disclosure can ensure that images are not distorted after the screens light up, and realize a function of returning to an original state normally after continuous stretches and deformation in a plurality of directions, thereby achieving characteristics of freely stretching display.

SUMMARY OF INVENTION

To solve the above problems, the present disclosure provides following technical solutions.

An embodiment of the present disclosure provides a display panel, which includes a flexible substrate and a plurality of display sections and retractable sections disposed on the flexible substrate in an array. Wherein, the retractable sections are configured to connect the display sections to each other and provide drive signals for the display sections; and the retractable sections are connected between sides of the display sections ranging from an end part to a central part of the sides of the display sections, each of the retractable sections includes four arc sections, one C-shaped section, and four straight sections, and bending directions of the four arc sections are different from a bending direction of the C-shaped section.

According to a preferred embodiment of the present disclosure, the four arc sections include two first arc sections and two second arc sections, the four straight sections include two first straight sections and two second straight sections, both ends of the C-shaped section are respectively connected to one end of one of the second arc sections by one of the second straight sections, another end of each of the second arc sections is respectively connected to one end of one of the first arc sections by one of the first straight sections, and another end of each of the first arc sections is respectively connected to one of the display sections.

According to a preferred embodiment of the present disclosure, a radius of curvature of the first arc sections is different from a radius of curvature of the second arc sections.

According to a preferred embodiment of the present disclosure, four of the display sections adjacent to each other are connected to form a periodic unit having a ring structure by the retractable sections, and in the four of the display sections adjacent to each other, two opposite display sections are arranged symmetrically to each other with respect to a horizontal direction or a vertical direction.

According to a preferred embodiment of the present disclosure, widths of the first arc sections, the second arc sections, the straight sections, and the C-shaped section are same.

According to a preferred embodiment of the present disclosure, an inner arc radius of the C-shaped section is R3, an inner arc radius of the first arc sections is R1, an inner arc radius of the second arc sections is R2, and both R1 and R2 are not less than R3.

According to a preferred embodiment of the present disclosure, an end part of an outer arc of the first arc sections is provided with a chamfer R4.

According to a preferred embodiment of the present disclosure, the display sections include an array substrate and a light-emitting device layer disposed on the array substrate; the array substrate includes at least driving thin film transistors, and the light-emitting device layer includes one or more of red light-emitting blocks, green light-emitting blocks, and blue light-emitting blocks; and each light-emitting block includes at least an anode, a light-emitting layer disposed on the anode, and a cathode layer disposed on the light-emitting layer, and the anode is electrically connected to a drain electrode of one of the driving thin film transistors.

According to a preferred embodiment of the present disclosure, the retractable sections include metal wiring groups arranged side by side, and the metal wiring groups are configured to transmit data signals, scanning signals, drive voltage signals, and voltage transmission signals.

According to a preferred embodiment of the present disclosure, a light-emitting area of the blue light-emitting blocks is greater than or equal to a sum of light-emitting areas of the red light-emitting blocks and the green light-emitting blocks.

According to a preferred embodiment of the present disclosure, R1 ranges from 10 um to 50 um, R2 ranges from 5 um to 25 um, and R3 ranges from 5 um to 15 um.

According to a preferred embodiment of the present disclosure, a material of the metal wiring groups includes one or more of molybdenum, copper, chromium, tungsten, tantalum, titanium, aluminum, and aluminum alloy.

According to the above display panel, the present disclosure further provides a display device, which includes a display panel. Wherein, the display panel includes a flexible substrate and a plurality of display sections and retractable sections disposed on the flexible substrate in an array, and the retractable sections are configured to connect the display sections to each other and provide drive signals for the display sections;

the retractable sections are connected between sides of the display sections ranging from an end part to a central part of the sides of the display sections, each of the retractable sections includes at least four arc sections, one C-shaped section, and four straight sections, and bending directions of the four arc sections are different from a bending direction of the C-shaped section; and wherein, the four arc sections include two first arc sections and two second arc sections, the four straight sections include two first straight sections and two second straight sections, both ends of the C-shaped section are respectively connected to one end of one of the second arc sections by one of the second straight sections, another end of each of the second arc sections is respectively connected to one end of one of the first arc sections by one of the first straight sections, and another end of each of the first arc sections is respectively connected to one of the display sections.

According to a preferred embodiment of the present disclosure, a radius of curvature of the first arc sections is different from a radius of curvature of the second arc sections.

According to a preferred embodiment of the present disclosure, four of the display sections adjacent to each other are connected to form a periodic unit having a ring structure by the retractable sections, and in the four of the display sections adjacent to each other, two opposite display sections are arranged symmetrically to each other with respect to a horizontal direction or a vertical direction.

According to a preferred embodiment of the present disclosure, widths of the first arc sections, the second arc sections, the straight sections, and the C-shaped section are same.

According to a preferred embodiment of the present disclosure, 6. The display panel according to claim 5, wherein an inner arc radius of the C-shaped section is R3, an inner arc radius of the first arc sections is R1, an inner arc radius of the second arc sections is R2, and both R1 and R2 are not less than R3.

According to a preferred embodiment of the present disclosure, an end part of an outer arc of the first arc sections is provided with a chamfer R4.

According to a preferred embodiment of the present disclosure, the display sections include an array substrate and a light-emitting device layer disposed on the array substrate; the array substrate includes at least driving thin film transistors, and the light-emitting device layer includes one or more of red light-emitting blocks, green light-emitting blocks, and blue light-emitting blocks; and each light-emitting block includes at least an anode, a light-emitting layer disposed on the anode, and a cathode layer disposed on the light-emitting layer, and the anode is electrically connected to a drain electrode of one of the driving thin film transistors.

According to a preferred embodiment of the present disclosure, the retractable sections include metal wiring groups arranged side by side, and the metal wiring groups are configured to transmit data signals, scanning signals, drive voltage signals, and voltage transmission signals.

Beneficial effect: the embodiments of the present disclosure provide the display panel and the display device. The display panel includes the flexible substrate and the plurality of display sections and retractable sections disposed on the flexible substrate in an array, wherein, the retractable sections are configured to connect the display sections to each other. Each of the retractable sections includes at least four arc sections, one C-shaped section, and four straight sections. Under external forces in all directions, the arc sections and the C-shaped section extend and are deformed along different directions in a plane, the straight sections can buffer stresses caused by the extension and deformation, and gaps between the retractable sections and the display sections will become larger, thereby ensuring the retractable sections to realize continuous stretches and deformation in any direction of a space, and ensuring a tensile elongation in any direction not to be less than 5%. The retractable sections are connected between the sides of the display sections ranging from the end part to the central part of the sides of the display sections, which ensures the gaps between the retractable sections and the display sections to be smaller and can arrange more display sections in a same pixel space, thereby ensuring a pixel density not to be less than 70.5 PPI and improving a resolution of the display panel.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

The present disclosure is directed to and solves defects of deformable display screens only having display function in a certain spatial direction, and a display device layer and a voltage transmission layer having permanent fracture and losing effectiveness after flexible display panels are stretched and deformed in any spatial directions in current technology. Therefore, the present disclosure can ensure that images are not distorted after the screens light up, and realize a function of returning to an original state normally after continuous stretches and deformation in a plurality of directions, thereby achieving characteristics of freely stretching display.

An embodiment of the present disclosure provides a display panel, which includes a flexible substrate and a plurality of display sections and retractable sections disposed on the flexible substrate in an array. Wherein, the retractable sections are configured to connect the display sections to each other and provide drive signals for the display sections. The retractable sections are connected between sides of the display sections ranging from an end part to a central part of the sides of the display sections, each of the retractable sections includes four arc sections, one C-shaped section, and four straight sections, and bending directions of the four arc sections are different from a bending direction of the C-shaped section. A specific or partial structure of the present disclosure is described in FIGS. 1 to 9.

Figure 1:
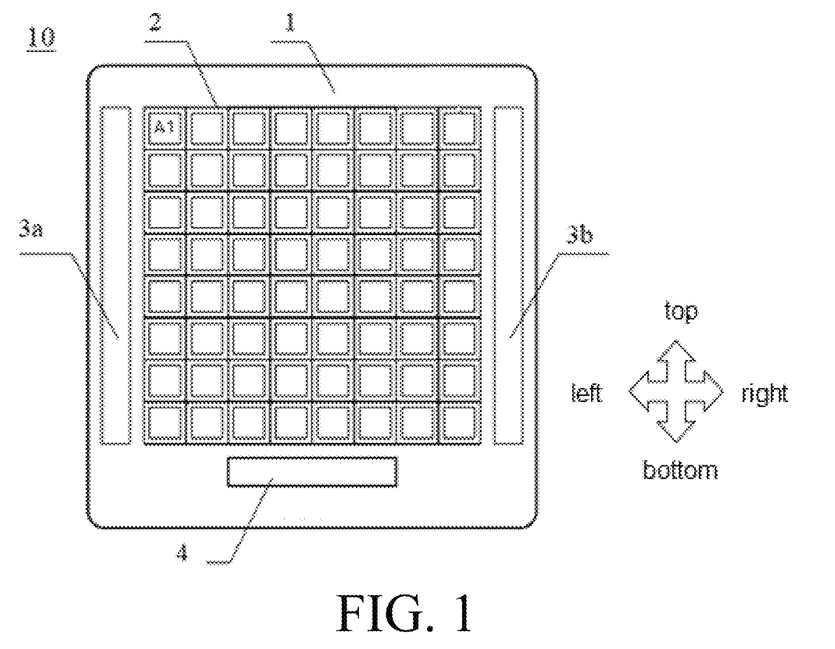
FIG. 1 is a schematic structural diagram of a display panel according to an embodiment of the present disclosure.

As shown in FIG. 1, an embodiment of the present disclosure provides a schematic structural top view of the display panel 10. The display panel 10 includes the flexible substrate 1, and the flexible substrate 1 is defined with a display area and a non-display area surrounding the display area. The non-display area includes a left-side non-display area, a right-side non-display area, an upper non-display area, and a lower non-display area. The left-side non-display area is provided with a first gate driver 3a, the right-side non-display area is provided with a second gate driver 3b, and the lower non-display area is provided with a data driver 4. Scanning lines and data lines are disposed crosswise and insulated to each other in the display area, and are arranged in two layers without overlapping between each other. The first gate driver 3a and the second gate driver 3b are connected to the scanning lines to output gate signals, the data driver 4 is connected to the data lines to output data signals, and the first gate driver 3a and the second gate driver 3b preferably adopt a double-sided interlaced scanning gate driver on array (GOA) circuit.

The crossed scanning lines and data lines divide the display area into a plurality of independent pixel units A1 and limit areas of the pixel units A1. The pixel units A1 are disposed on the flexible substrate 1 and have a grid shape. The pixel units A1 of the embodiment are arranged on the flexible substrate in the array and include the display sections arranged at intervals and the retractable sections configured to connect the display sections. The retractable sections include metal wiring groups arranged side by side, and the metal wiring groups are configured to transmit data signals, scanning signals, drive voltage signals, and voltage transmission signals, thereby realizing normal illumination of the display sections.

Figure 2:
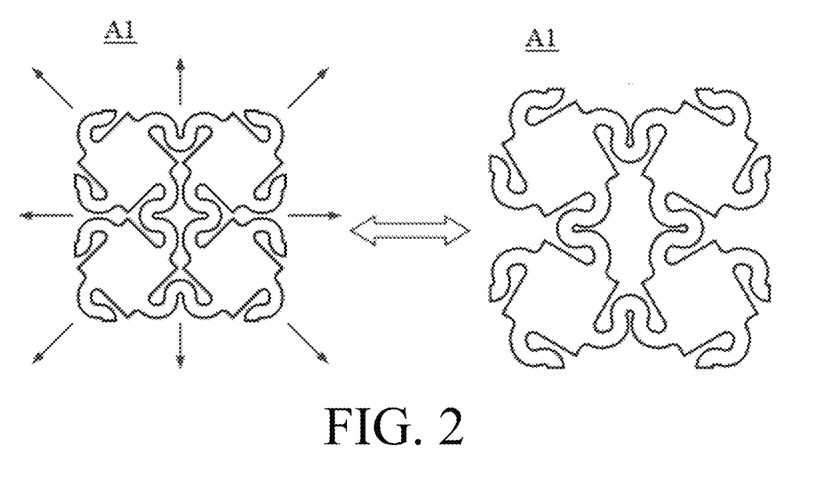
FIG. 2 is a schematic structural diagram of stretches and contractions of display sections and retractable sections in the display panel according to an embodiment of the present disclosure.

As shown in FIG. 2, an embodiment of the present disclosure provides a schematic structural diagram of stretches and contractions of one periodic unit of the pixel units A1 in the display panel. Each pixel unit A1 includes one or more of periodic unit, and the periodic unit includes four display sections and four retractable sections adjacent to each other. The four adjacent display sections are connected to each other to form the periodic unit having a ring structure by the retractable sections. In the four adjacent display sections, two opposite display sections are arranged symmetrically to each other with respect to a horizontal direction or a vertical direction, and this disposition can improve tensile properties, ductility, and deformability. A double-headed arrow in FIG. 2 represents that a left-side configuration and a right-side configuration can be converted to each other. When the display panel is folded, compressed, or stretched under external forces, the retractable sections will extend and are deformed along different directions in a plane under tensile forces in all directions, gaps between the adjacent display sections will have corresponding changes, and meanwhile the display sections will have follow-up rotations, thereby realizing retractable properties. When the external forces disappear, the retractable sections will return to their original states, and the display panel will return to its original state.

Figure 3:
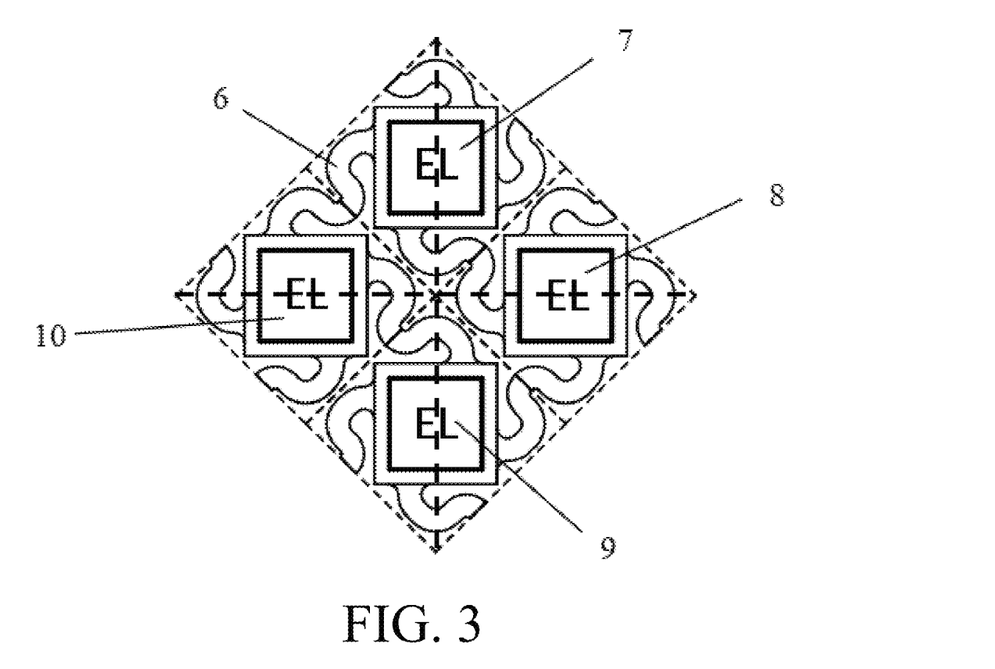
FIG. 3 is a schematic structural diagram of a periodic unit in the display panel according to an embodiment of the present disclosure.

As shown in FIG. 3, an embodiment of the present disclosure provides a schematic structural diagram of the periodic unit. The periodic unit is a square having a predetermined inclined angle in a top view. The periodic unit includes a display section 7, a display section 8, a display section 9, and a display section 10 adjacent to each other.

Adjacent sides of any two of the display sections are connected to each other by one of the retractable sections, and the retractable sections are connected between the sides of the display sections ranging from the end part to the central part of the sides of the display sections, which ensures the gaps between the retractable sections and the display sections to be smaller and can arrange more display sections in a same pixel space, thereby increasing a density of the display sections and improving a resolution of the display panel. The display section 7 and the display section 9 are arranged symmetrically with respect to a vertical direction, and the display section 8 and the display section 10 are arranged symmetrically with respect to a horizontal direction, which form a cross when connecting centers of the display sections EL (shown as bold dotted lines in FIG. 3). The four display sections are positioned at end parts of the cross, and each of the display sections EL is also a square in the top view. Each side of the display sections EL is connected with at most one retractable section 6 having a bent or curved shape, and the four display sections form the ring structure by the retractable sections 6. The retractable sections 6 in this embodiment is preferably bow-shaped, thereby having self-restoring properties.

Figure 4:
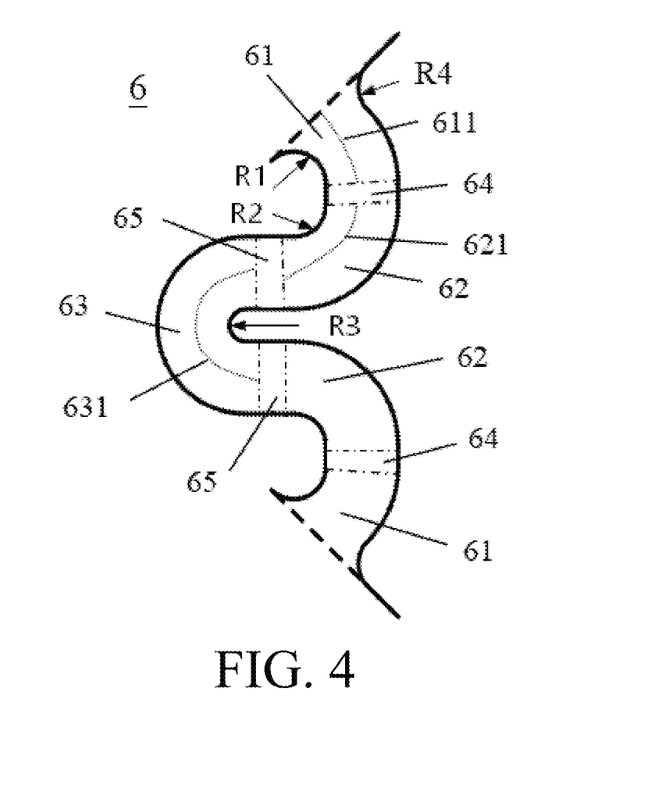
FIG. 4 is a schematic structural diagram of one of the retractable sections in the display panel according to an embodiment of the present disclosure.

As shown in FIG. 4, an embodiment of the present disclosure provides a schematic structural diagram of the retractable section. The retractable section 6 includes four arc sections, one C-shaped section 63, and four straight sections, and bending directions of the four arc sections are different from a bending direction of the C-shaped section. The four arc sections include two first arc sections 61 and two second arc sections 62, the four straight sections include two first straight sections 64 and two second straight sections 65, both ends of the C-shaped section 63 are respectively connected to one end of one of the second arc sections 62 by one of the second straight sections 65, another end of each of the second arc sections 62 is respectively connected to one end of one of the first arc sections 61 by one of the first straight sections 64, and another end of each of the first arc sections 61 is respectively connected to one of the display sections. A radius of curvature of the first arc sections 61 is different from a radius of curvature of the second arc sections 62. The radius of curvature of the first arc sections 61 is a radius of curvature of a center plane 611 of the first arc sections, the radius of curvature of the second arc sections 62 is a radius of curvature of a center plane 621 of the second arc sections 62, and a radius of curvature of the C-shaped section 63 is a radius of curvature of a center plane 631 of the C-shaped section. Doted lines in FIG. 4 are only used to describe a structure of the retractable section and not exist in an actual structure.

An overall contour of the retractable section 6 has a smooth transition, an inner arc radius of the first arc sections is R1, an end part of an outer arc of the first arc sections 61 is provided with a chamfer R4, and R4 is preferably equal to R1. Due to existences of R1 and R4, sides from end parts of the retractable section 6 to the display sections have arc transitions, thereby preventing stresses from concentrating. An inner arc radius of the second arc sections 62 is R2, and the first straight sections 64 are disposed between the first arc sections 61 and the second arc sections 62. A length of the first straight sections 64 is shorter, which is used to buffer bending stresses between the first arc sections 61 and the second arc sections 62 and reduce bending stress concentration in the arc sections. The second straight sections 65 are disposed between the C-shaped section 63 and the second arc sections 62. A length of the second straight sections 65 is also shorter, which is used to buffer bending stresses between the C-shaped section 63 and the second arc sections 62 and reduce bending stress concentration.

Two sides of the retractable section 6 are symmetrical about a center line of the C-shaped section 63. One of the first arc sections 61, one of the first straight sections 64, and one of the second arc sections 62 adjacent to each other constitute a three-quarter U-shaped structure. Widths W of the first arc sections 61, the second arc sections 62, the first straight sections 64, the second straight sections 65, and the C-shaped section 63 are all equal, thereby better reducing stresses in the retractable sections during bending and obtaining uniform stresses. The inner arc radius R1 of the first arc sections 61 ranges from 10 um to 50 um, the inner arc radius R2 of the second arc sections 62 ranges from 5 um to 25 um, an inner arc radius R3 of the C-shaped section 63 ranges from 5 um to 15 um, R4 ranges from 10 um to 50 um, and W ranges from 10 um to 50 um.

Figure 5:
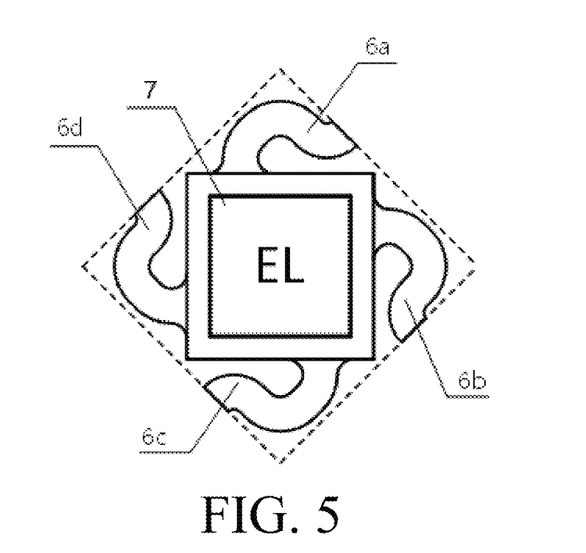
FIG. 5 is a schematic connection structural top view of the display sections and the retractable sections in the display panel according to an embodiment of the present disclosure.

As shown in FIG. 5, an embodiment of the present disclosure provides a schematic disposition diagram between one display section and the retractable sections. The display section 7 is square in the top view, and each side of the display section 7 is connected with one retractable section. Viewed from a clockwise direction, a first side of the display section 7 is connected with a retractable section 6a, a second side is connected with a retractable section 6b, a third side is connected with a retractable section 6c, and a fourth side is connected with a retractable section 6d. The retractable section 6a, the retractable section 6b, the retractable section 6c, and the retractable section 6d are distributed surrounding the display section 7 in a centrosymmetric way to form island structures having bending functions. Any two adjacent retractable sections have a gap, and a width of the gap is greater than or equal to 20 um, which has enough space for deformation and retraction.

Figure 6:
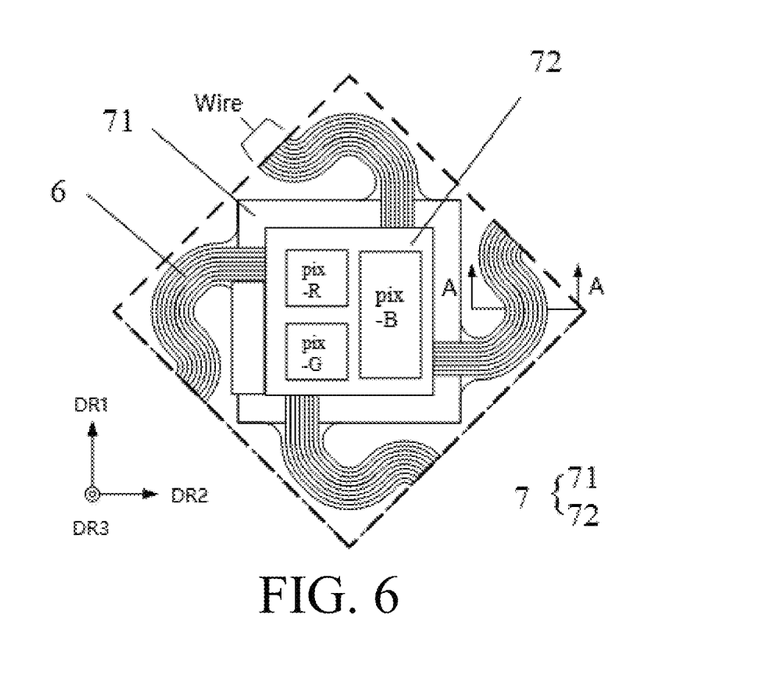
FIG. 6 is a schematic structural diagram of connected film layers of the display sections and the retractable sections in the display panel according to an embodiment of the present disclosure.
Figure 7:
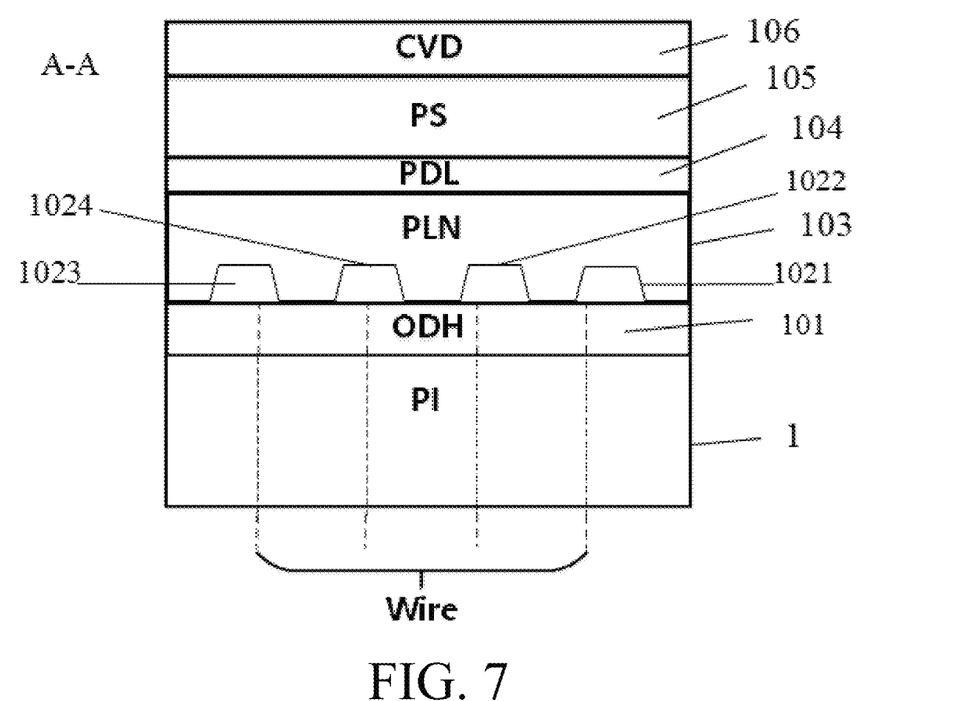
FIG. 7 is a schematic film layer structural diagram of the retractable sections in the display panel according to an embodiment of the present disclosure.
Figure 8:
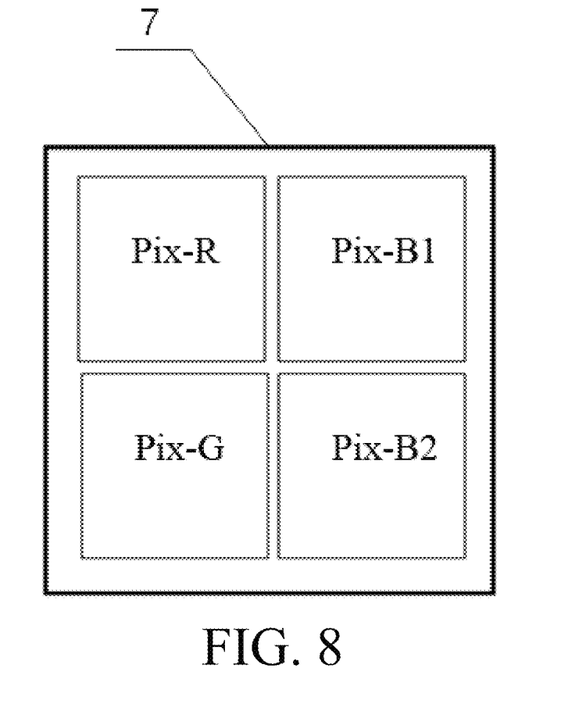
FIG. 8 is another schematic structural diagram of the display sections in the display panel according to an embodiment of the present disclosure.

As shown in FIGS. 6 and 7, an embodiment of the present disclosure provides a schematic diagram of connections between the display section and the retractable sections. The display section 7 includes an array substrate 71 and a light-emitting device layer 72 disposed on the array substrate 71. The array substrate 71 includes at least one driving thin film transistor. The driving thin film transistor includes a light-shielding layer disposed on the flexible substrate 1, a buffer layer 101 disposed on the light-shielding layer, an active layer disposed on the buffer layer 101, a gate insulating layer disposed on the active layer, a gate electrode disposed on the gate insulating layer, an interlayer insulating layer disposed on the gate electrode, a source electrode and a drain electrode disposed on the interlayer insulating layer, and a planarization layer 103 disposed on the source electrode and the drain electrode. The source electrode is connected to a source electrode doped area in the active layer by a source electrode contact hole, and the drain electrode is connected to a drain electrode doped area in the active layer by a drain electrode contact hole. The light-emitting device layer 72 includes one or more of red light-emitting blocks, green light-emitting blocks, and blue light-emitting blocks. Each light-emitting block emits light independently and is encapsulated independently using transparent polyimide films. Each light-emitting block includes an anode disposed on the planarization layer, a light-emitting layer disposed on the anode, and a cathode layer disposed on the light-emitting layer. The anode is electrically connected to the drain electrode by an anode via hole, and the cathode layer is connected to an external power supply in a pixel driving circuit.

The retractable sections of this embodiment are disposed in gaps between the display sections. FIG. 7 is a crosssectional film layer diagram of the retractable sections along A-A. The retractable sections include the flexible substrate 1, a buffer layer 101 disposed on the flexible substrate 1, a metal wiring group disposed on the buffer layer 101, the planarization layer 103 disposed on the metal wiring group, a pixel definition layer 104 disposed on the planarization layer 103, a spacer layer 105 disposed on the pixel definition layer 104, and an encapsulation layer 106 disposed on the spacer layer 105. Wherein, the metal wiring group includes a first metal signal line 1021, a second metal signal line 1022, a third metal signal line 1023, and a fourth metal signal line 1024 arranged side by side. The first metal signal line 1021, the second metal signal line 1022, the third metal signal line 1023, and the fourth metal signal line 1024 are configured to transmit data signals, scanning signals, drive voltage signals, and voltage transmission signals, respectively. Spacings Z between the metal signal lines preferably range from 5 um to 35 um, and a material of the metal wiring group is preferably one or more of molybdenum, copper, chromium, tungsten, tantalum, titanium, aluminum, and aluminum alloy.

In order to realize that the pixel units can still display normally when the display panel 10 is deformed, each retractable section in this embodiment includes metal wiring groups arranged side by side. Each metal wiring group includes at least function signal lines such as data lines, gate electrode lines, drive voltage lines, and voltage transmission lines. Corresponding function signal lines of the metal wiring groups are electrically connected to the scanning lines and the data lines in the display area, and exposed terminals in the array substrate 71 are connected to the metal wiring groups, so the array substrate 71 can be electrically connected to the scanning lines and the data lines by the corresponding metal wiring groups in the retractable sections, thereby realizing normal transmission of the drive signals in sequence. The metal wiring groups are manufactured by elastic-plastic metal materials and are bent or curved for allowing the metal wiring groups to deform after stretching or compressing the display panel. After the stretching or compressing disappears, the metal wiring groups will return to their original states, and a tensile elongation of the metal wiring groups in any direction is not less than 5%.

The light-emitting device layer in FIG. 6 includes one red light-emitting block, one green light-emitting block, and one blue light-emitting block. The light-emitting device layer in FIG. 8 includes one red light-emitting block, one green light-emitting block, and two blue light-emitting blocks. From FIGS. 6 and 8, it can be known that the red light-emitting blocks, the green light-emitting blocks, and the blue light-emitting blocks all emit light independently, and a light-emitting area of the blue light-emitting blocks is greater than or equal to a sum of light-emitting areas of the red light-emitting blocks and the green light-emitting blocks.

Figure 9:
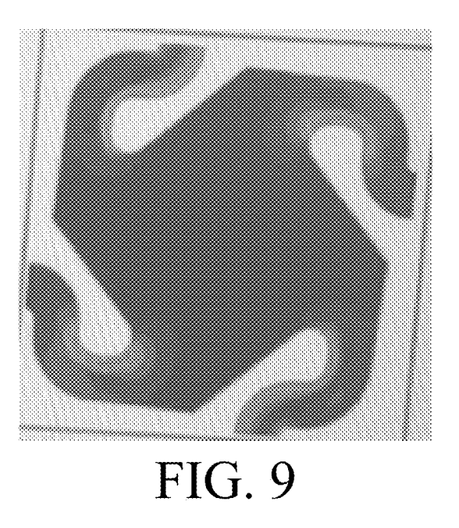
FIG. 9 is a stress nephogram of the display sections and the retractable sections in the display panel according to an embodiment of the present disclosure.

In order to verify that an improved pixel unit structure of the present disclosure has better mechanical properties, the inventors use Finite Element Software to select different parameters for radii of bending parts in the improved pixel unit structure and apply a same load to obtain different stress nephograms. From the stress nephograms, weak structural locations and a maximum stress in the pixel unit structure can be obtained. The inventors use control variates and have R4 to be 20 um, 25 um, 30 um, 40 um, or 50 um while maintain parameters of R1, R2, R3, W, and Z to be unchanged. In the five simulation tests, an optimal test group of R1=20 um, R2=20 um, R3=10 um, R4=25 um, W=45 um, and Z=20 um is selected by the stress nephograms and a maximum principal stress. A stress nephogram of an island-shaped display section is shown in FIG. 9. The maximum principal stress is 0.0163 Pa and is distributed on inner sides of the retractable sections, wherein, local stress distribution is more coordinated, and stresses in the position are smaller than other positions, continuous, and uniform.

According to the above display panel, the present disclosure further provides a display device, which includes the display panel of the above embodiments.

The embodiments of the present disclosure provide the display panel and the display device. The display panel includes the flexible substrate and the plurality of display sections and retractable sections disposed on the flexible substrate in the array, wherein, the retractable sections are configured to connect the display sections to each other. Each of the retractable sections includes at least four arc sections, one C-shaped section, and four straight sections. Under external forces in all directions, the arc sections and the C-shaped section extend and are deformed along different directions in a plane, the straight sections can buffer stresses caused by the extension and deformation, and gaps between the retractable sections and the display sections will become larger, thereby ensuring the retractable sections to realize continuous stretches and deformation in any direction of a space, and ensuring the tensile elongation in any direction not to be less than 5%. The retractable sections are connected between the sides of the display sections ranging from the end part to the central part of the sides of the display sections, which ensures the gaps between the retractable sections and the display sections to be smaller and can arrange more display sections in the same pixel space, thereby ensuring a pixel density not to be less than 70.5 PPI and improving the resolution of the display panel.

The present disclosure has been described with preferred embodiments thereof. The preferred embodiments are not intended to limit the present disclosure, and it is understood that many changes and modifications to the described embodiments can be carried out without departing from the scope and the spirit of the disclosure that is intended to be limited only by the appended claims.

What is claimed is:

1. A display panel, comprising a flexible substrate and a plurality of display sections and sets of retractable sections disposed on the flexible substrate in an array, wherein each display section is directly connected to the retractable sections of each set, and the retractable sections are configured to connect the display sections to each other and provide drive signals for the display sections; and wherein the retractable sections are connected between sides of the display sections ranging from an end part to a central part of the sides of the display sections, each of the retractable sections has a connection end connected to an offset part of the side of a corresponding one of the display sections located between the end part and the central part and comprises at least four arc sections, one C-shaped section, and four straight sections, and bending directions of the four arc sections are different from a bending direction of the C-shaped section;

wherein each display section and the retractable sections of the set corresponding to the display section form an axial-symmetric pattern.

2. The display panel according to claim 1, wherein the four arc sections comprise two first arc sections and two second arc sections, the four straight sections comprise two first straight sections and two second straight sections, both ends of the C-shaped section are respectively connected to one end of one of the second arc sections by one of the second straight sections, another end of each of the second arc sections is respectively connected to one end of one of the first arc sections by one of the first straight sections, and another end of each of the first arc sections is respectively connected to one of the display sections.

3. The display panel according to claim 2, wherein a radius of curvature of the first arc sections is different from a radius of curvature of the second arc sections.

4. The display panel according to claim 1, wherein four of the display sections adjacent to each other are connected to form a periodic unit having a ring structure by the retractable sections, and in the four of the display sections adjacent to each other, two opposite display sections are arranged symmetrically to each other with respect to a horizontal direction or a vertical direction.

5. The display panel according to claim 2, wherein widths of the first arc sections, the second arc sections, the straight sections, and the C-shaped section are same.

6. The display panel according to claim 5, wherein an inner arc radius of the C-shaped section is R3, an inner arc radius of the first arc sections is R1, an inner arc radius of the second arc sections is R2, and both R1 and R2 are not less than R3.

7. The display panel according to claim 2, wherein an end part of an outer arc of the first arc sections is provided with a chamfer R4.

8. The display panel according to claim 1, wherein the display sections comprise an array substrate and a light-emitting device layer disposed on the array substrate;
the array substrate comprises at least driving thin film transistors, and the light-emitting device layer comprises one or more of red light-emitting blocks, green light-emitting blocks, and blue light-emitting blocks; and
each light-emitting block comprises at least an anode, a light-emitting layer disposed on the anode, and a cathode layer disposed on the light-emitting layer, and the anode is electrically connected to a drain electrode of one of the driving thin film transistors.

9. The display panel according to claim 1, wherein the retractable sections comprise metal wiring groups arranged side by side, and the metal wiring groups are configured to transmit data signals, scanning signals, drive voltage signals, and voltage transmission signals.

10. The display panel according to claim 8, wherein a light-emitting area of the blue light-emitting blocks is greater than or equal to a sum of light-emitting areas of the red light-emitting blocks and the green light-emitting blocks.

11. The display panel according to claim 6, wherein R1 ranges from 10 um to 50 um, R2 ranges from 5 um to 25 um, and R3 ranges from 5 um to 15 um.

12. The display panel according to claim 9, wherein a material of the metal wiring groups comprises one or more of molybdenum, copper, chromium, tungsten, tantalum, titanium, aluminum, and aluminum alloy.

13. A display device, comprising a display panel, wherein the display panel comprises a flexible substrate and a plurality of display sections and sets of retractable sections disposed on the flexible substrate in an array, each display section is directly connected to the retractable sections of each set, and the retractable sections are configured to connect the display sections to each other and provide drive signals for the display sections;
the retractable sections are connected between sides of the display sections ranging from an end part to a central part of the sides of the display sections, each of the retractable sections has a connection end connected to an offset part of the side of a corresponding one of the display sections located between the end part and the central part and comprises at least four arc sections, one C-shaped section, and four straight sections, and bending directions of the four arc sections are different from a bending direction of the C-shaped section;
the four arc sections comprise two first arc sections and two second arc sections, the four straight sections comprise two first straight sections and two second straight sections, both ends of the C-shaped section are respectively connected to one end of one of the second arc sections by one of the second straight sections, another end of each of the second arc sections is respectively connected to one end of one of the first arc sections by one of the first straight sections, and another end of each of the first arc sections is respectively connected to one of the display sections; and
each display section and the retractable sections of the set corresponding to the display section form an axial-symmetric pattern.

14. The display device according to claim 13, wherein a radius of curvature of the first arc sections is different from a radius of curvature of the second arc sections.

15. The display device according to claim 13, wherein four of the display sections adjacent to each other are connected to form a periodic unit having a ring structure by the retractable sections, and in the four of the display sections adjacent to each other, two opposite display sections are arranged symmetrically to each other with respect to a horizontal direction or a vertical direction.

16. The display device according to claim 13, wherein widths of the first arc sections, the second arc sections, the straight sections, and the C-shaped section are same.

17. The display device according to claim 16, wherein an inner arc radius of the C-shaped section is R3, an inner arc radius of the first arc sections is R1, an inner arc radius of the second arc sections is R2, and both R1 and R2 are not less than R3.

18. The display device according to claim 13, wherein an end part of an outer arc of the first arc sections is provided with a chamfer R4.

19. The display device according to claim 13, wherein the display sections comprise an array substrate and a light-emitting device layer disposed on the array substrate;
the array substrate comprises at least driving thin film transistors, and the light-emitting device layer comprises one or more of red light-emitting blocks, green light-emitting blocks, and blue light-emitting blocks; and
each light-emitting block comprises at least an anode, a light-emitting layer disposed on the anode, and a cathode layer disposed on the light-emitting layer, and the anode is electrically connected to a drain electrode of one of the driving thin film transistors.

20. The display device according to claim 13, wherein the retractable sections comprise metal wiring groups arranged side by side, and the metal wiring groups are configured to transmit data signals, scanning signals, drive voltage signals, and voltage transmission signals.

* * * * *